(12) United States Patent
Lu et al.

(10) Patent No.: US 10,468,465 B1
(45) Date of Patent: Nov. 5, 2019

(54) DISPLAY PANEL AND FABRICATION METHOD, AND DISPLAY DEVICE THEREOF

(71) Applicant: WUHAN TIANMA MICRO-ELECTRONICS CO., LTD., Wuhan (CN)

(72) Inventors: Xing Lu, Wuhan (CN); Yongzhi Wang, Wuhan (CN); Tao Peng, Wuhan (CN); Min Li, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/167,667

(22) Filed: Oct. 23, 2018

(30) Foreign Application Priority Data

Jul. 27, 2018 (CN) .......................... 2018 1 0840353

(51) Int. Cl.
| | |
|---|---|
| *H01L 27/32* | (2006.01) |
| *H01L 51/52* | (2006.01) |
| *H01L 51/56* | (2006.01) |
| *G06K 9/00* | (2006.01) |

(52) U.S. Cl.
CPC ...... *H01L 27/3227* (2013.01); *G06K 9/00087* (2013.01); *H01L 27/3216* (2013.01); *H01L 51/5218* (2013.01); *H01L 51/5221* (2013.01); *H01L 51/56* (2013.01)

(58) Field of Classification Search
CPC . H01L 27/3216; H01L 27/3227; H01L 51/56; H01L 51/5218; H01L 51/5221; G06K 9/00087

See application file for complete search history.

(56) References Cited

U.S. PATENT DOCUMENTS

| | | | |
|---|---|---|---|
| 2008/0048560 A1* | 2/2008 | Sung .................... | H01L 27/3213 313/504 |
| 2018/0005007 A1* | 1/2018 | Du ....................... | H01L 27/3262 |

\* cited by examiner

*Primary Examiner* — Peniel M Gumedzoe
(74) *Attorney, Agent, or Firm* — Anova Law Group PLLC

(57) ABSTRACT

A display panel and fabrication method, and a display device are provided. The display panel includes a base substrate and a plurality of first units formed over the base substrate. A first unit includes an organic light-emitting diode, a fingerprint recognition unit, and a first micro-cavity. The organic light-emitting diode includes an anode, a cathode disposed opposite to the anode, and an organic light-emitting layer disposed between the anode and the cathode. The display panel also includes a plurality of first film layers formed over the base substrate. A first film layer is disposed between two adjacent mutually insulated anodes. The cathode covers the anode and the first film layer, and the first micro-cavity is formed between the first film layer and the cathode. The fingerprint recognition unit is disposed over a side of the first film layer away from the cathode.

20 Claims, 7 Drawing Sheets

DISPLAY PANEL AND FABRICATION METHOD, AND DISPLAY DEVICE THEREOF

CROSS-REFERENCES TO RELATED APPLICATIONS

This application claims the priority of Chinese patent application No. 201810840353.0, filed on Jul. 27, 2018, the entirety of which is incorporated herein by reference.

FIELD OF THE DISCLOSURE

The present disclosure generally relates to the field of display technology and, more particularly, relates to a display panel and fabrication method, and a display device thereof.

BACKGROUND

An organic light-emitting diode (OLED) is also known as an organic electro-laser display, or an organic light-emitting semiconductor. OLED display technology is featured with advantages such as self-illumination, wide viewing angle, nearly infinite contrast, low power consumption, and substantially high response speed, etc.

In an under-screen fingerprint recognition technology, the light emitted from the light source is reflected by a touch object to a fingerprint recognition unit for fingerprint recognition. Because the light desires to pass through at least part of the display panel, the intensity of the light has a great influence on the fingerprint recognition accuracy.

In an existing organic light-emitting display panel, in addition to the absorption and scattering of the film layer(s), because metal wiring has to occupy a large space, under the premise of limited process capability, the light-transmissive area of the display panel is substantially small, the intensity of the light received by the fingerprint recognition unit is substantially weak, and, thus, the fingerprint recognition accuracy of the display panel is substantially poor.

The disclosed display panel and fabrication method, and display device are directed to solve one or more problems set forth above and other problems.

BRIEF SUMMARY OF THE DISCLOSURE

One aspect of the present disclosure provides a display panel. The display panel includes a base substrate and a plurality of first units formed over the base substrate. A first unit of the plurality of first units includes an organic light-emitting diode, a fingerprint recognition unit, and a first micro-cavity. The organic light-emitting diode includes an anode, a cathode disposed opposite to the anode, and an organic light-emitting layer disposed between the anode and the cathode. The display panel also includes a plurality of first film layers formed over the base substrate. A first film layer of the plurality of first film layers is disposed between two adjacent mutually insulated anodes. The cathode covers the anode and the first film layer, and the first micro-cavity is formed between the first film layer and the cathode. The fingerprint recognition unit is disposed over a side of the first film layer away from the cathode.

Another aspect of the present disclosure provides a display device. The display device includes a display panel. The display panel includes a base substrate and a plurality of first units formed over the base substrate. A first unit of the plurality of first units includes an organic light-emitting diode, a fingerprint recognition unit, and a first micro-cavity. The organic light-emitting diode includes an anode, a cathode disposed opposite to the anode, and an organic light-emitting layer disposed between the anode and the cathode. The display panel also includes a plurality of first film layers formed over the base substrate. A first film layer of the plurality of first film layers is disposed between two adjacent mutually insulated anodes. The cathode covers the anode and the first film layer, and the first micro-cavity is formed between the first film layer and the cathode. The fingerprint recognition unit is disposed over a side of the first film layer away from the cathode.

Another aspect of the present disclosure provides a method for forming a display panel. The method includes providing a base substrate and forming a plurality of first units over the base substrate. A first unit of the plurality of first units includes an organic light-emitting diode, a fingerprint recognition unit, and a first micro-cavity. The organic light-emitting diode includes an anode, a cathode disposed opposite to the anode, and an organic light-emitting layer disposed between the anode and the cathode. The method also includes forming a plurality of first film layers over the base substrate. A first film layer of the plurality of first film layers is disposed between two adjacent mutually insulated anodes. The cathode covers the anode and the first film layer, and the first micro-cavity is formed between the first film layer and the cathode. The fingerprint recognition unit is disposed over a side of the first film layer away from the cathode.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
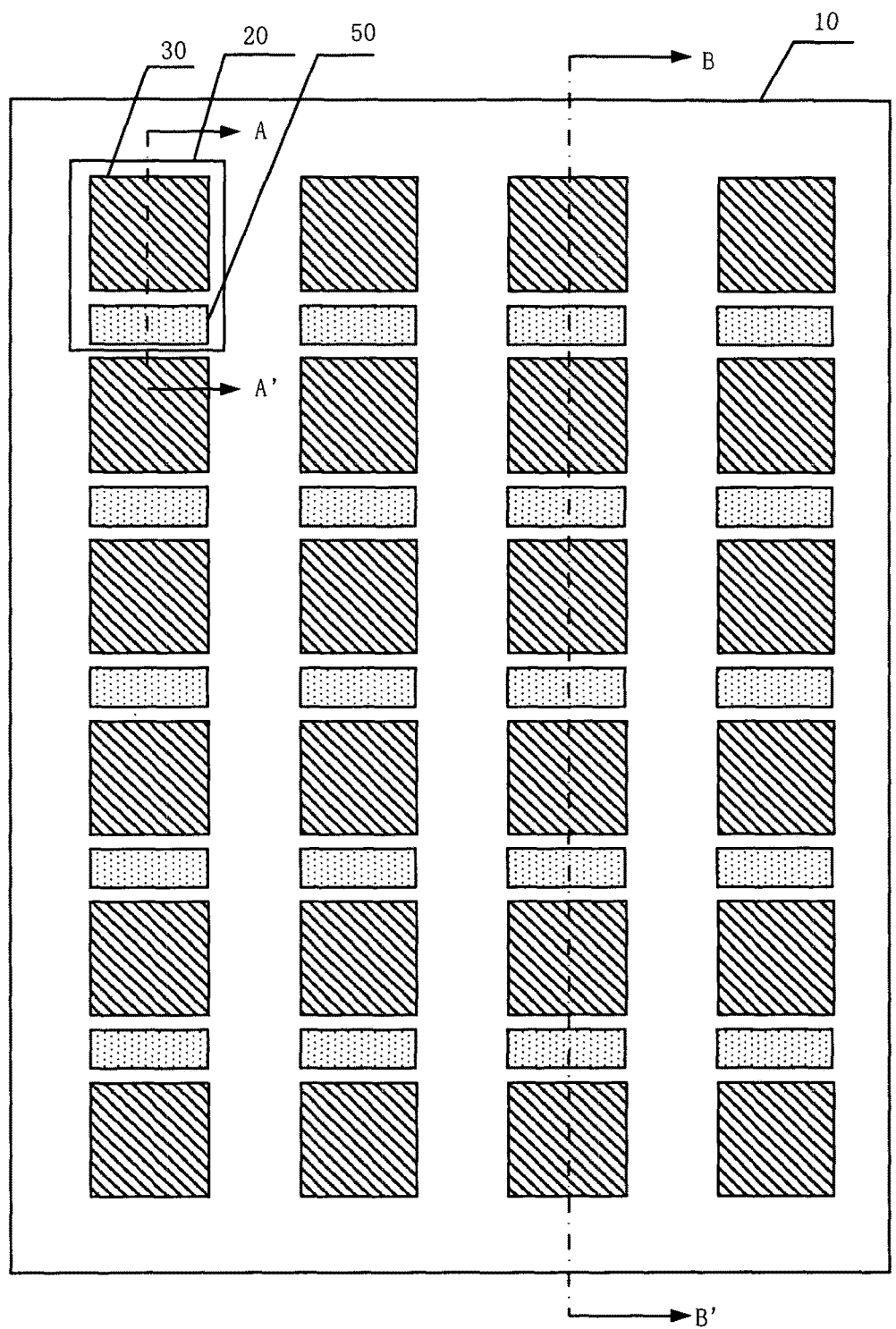
FIG. 1 illustrates a schematic diagram of an exemplary display panel consistent with disclosed embodiments of the present disclosure.
Figure 2:
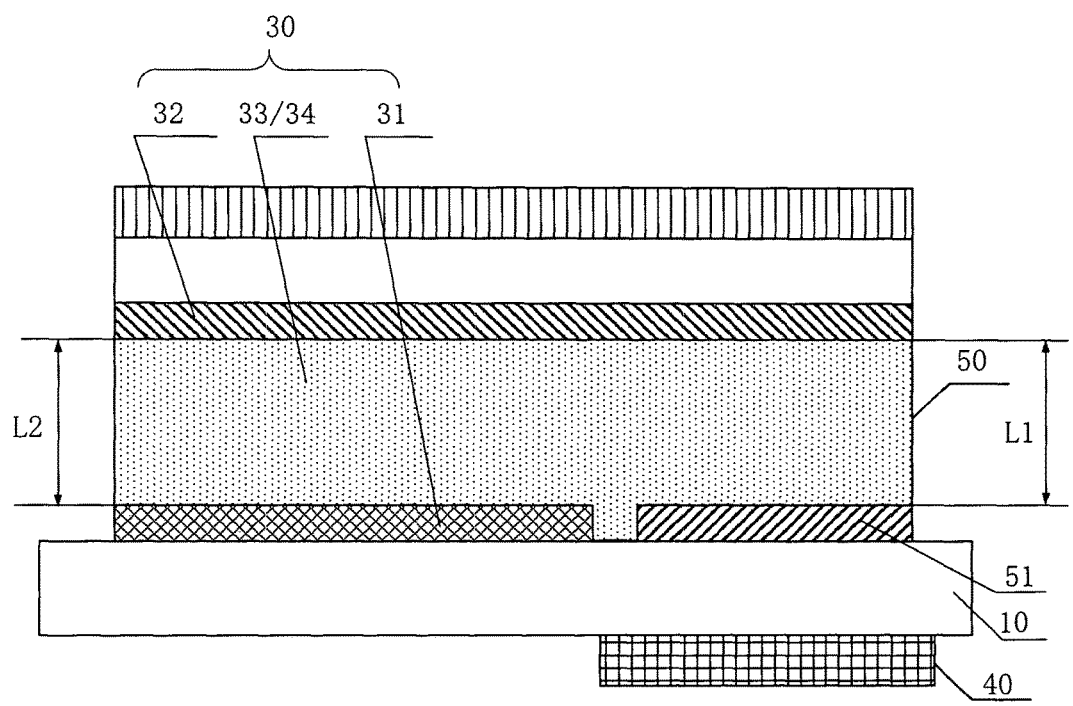
FIG. 2 illustrates a schematic A-A' sectional view of a first unit in an exemplary display panel in FIG. 1 consistent with disclosed embodiments of the present disclosure.

The present disclosure provides a display panel. FIG. 1 illustrates a schematic diagram of a display panel consistent with disclosed embodiments of the present disclosure; and FIG. 2 illustrates a schematic A-A' sectional view of the display panel in FIG. 2. Referring to FIGS. 1 and 2, the display panel may include a base substrate 10 and a plurality of first units 20 over the base substrate. The first unit 20 may include an organic light-emitting diode 30, a fingerprint recognition unit 40, and a first micro-cavity 50. The organic light-emitting diode 30 may include an anode 31, a cathode 32 disposed opposite to the anode 31, and an organic light-emitting layer 33 disposed between the anode 31 and the cathode 32.

The first unit 20 may further include a plurality of first film layers 51 disposed over the base substrate 10, and a first film layer 51 may be disposed between two adjacent mutually insulated anodes 31. The cathode 32 may cover the anode 31 and the first film layer 51. The first micro-cavity 50 may be formed between the first film layer 51 and the cathode 32. The fingerprint recognition unit 40 may be disposed over a side of the first film layer 51 away from the cathode 32.

In one embodiment, referring to FIGS. 1 and 2, a region corresponding to the organic light-emitting diode 30 may be a light-emitting region of the display panel, and a region between two adjacent organic light-emitting diodes 30 may be a non-light-emitting region of the display panel. The first micro-cavity 50 may be formed between the first film layer 51 and the cathode 32, and the intensity of light having a wavelength in a certain range may be enhanced by setting a cavity length of the first micro-cavity 50.

The display panel in the disclosed embodiments may include the plurality of first units 20. The first unit 20 may include the organic light-emitting diode 30, the fingerprint recognition unit 40, and the first micro-cavity 50. The organic light-emitting diode 30 may be in a one-to-one relationship with the fingerprint recognition unit 40, while which is not limited by the present disclosure. The fingerprint recognition unit 40 may desire to be disposed between adjacent organic light-emitting diodes 30. Referring to FIGS. 1 and 2, the fingerprint recognition unit 40 and the first micro-cavity 50 may be disposed between adjacent organic light-emitting diodes 30 in a row direction, which is not limited by the present disclosure and may be determined according to practical applications. In certain embodiments, the fingerprint recognition unit 40 and the first micro-cavity 50 may also be disposed between adjacent organic light-emitting diodes 30 in other directions.

The fingerprint identification unit 40 may generate fingerprint information according to received signal light. The intensity of the signal light may have a great influence on the fingerprint recognition accuracy of the fingerprint recognition unit 40. The stronger the signal light, the higher the fingerprint recognition accuracy of the fingerprint recognition unit 40. The fingerprint recognition unit 40 may be disposed over the side of the first film layer 51 away from the cathode 32. In other words, after passing through the first micro-cavity 50, the signal light may be transmitted to a corresponding fingerprint recognition unit 40, and, thus, the intensity of the light transmitted to the fingerprint recognition unit 40 may effectively increase, thereby effectively improving the fingerprint recognition accuracy of the fingerprint recognition unit 40.

The fingerprint recognition unit 40 in FIG. 2 may adopt an external fingerprint identification unit. The fingerprint recognition unit 40 may be disposed over a side of the base substrate 10 facing away from the organic light-emitting diode 30, while which is not limited by the present disclosure. The fingerprint recognition unit 40 may desire to be disposed over the side of the first film layer 51 away from the cathode 32, and, thus, after passing through the first micro-cavity 50, the signal light may be transmitted to the corresponding fingerprint recognition unit 40.

Referring to FIGS. 1 and 2, in one embodiment, for the light having a wavelength in a $\lambda$ range, the photoelectric conversion efficiency of the fingerprint recognition unit 40 is $\eta$, where $60\% < \eta < 100\%$, and $380\ nm \leq \lambda \leq 700\ nm$. The cavity length of the first micro-cavity 50 is L1, where $L1 = m \times \lambda/2$, and m is a positive integer. In one embodiment, to reduce material loss, m=1.

In one embodiment, for the light having a wavelength in a $\lambda$ range, the photoelectric conversion efficiency of the fingerprint recognition unit is $\eta$, where $60\% < \eta < 100\%$, and $380\ nm \leq \lambda \leq 700\ nm$. The photoelectric conversion efficiency of the fingerprint recognition unit may refer to a ratio of a quantity of photo-generated carriers collected by the fingerprint recognition unit over a quantity of incident photoelectrons in a unit time. The photoelectric sensitivity of the fingerprint recognition unit may be related to the photoelectric conversion efficiency. The higher the photoelectric conversion efficiency, the higher the photoelectric sensitivity of the fingerprint recognition unit. For the light having a wavelength in a range of approximately 380 nm-700 nm, the photoelectric conversion efficiency of the fingerprint recognition unit may be greater than 60%. In other words, the fingerprint recognition unit 40 may be sensitive to the light having a wavelength in a range of approximately 380 nm-700 nm, and, thus, the fingerprint recognition unit 40 may have a substantially high photoelectric sensitivity for the light having a wavelength in a range of approximately 380 nm-700 nm. The cavity length of the first micro-cavity 50 is L1, where $L1 = m \times \lambda/2$, m is a positive integer, and $380\ nm \leq \lambda \leq 700\ nm$. In other words, the first micro-cavity 50 may enhance the intensity of the light having a wavelength in a range of approximately 380 nm-700 nm in the light source. After passing through the first micro-cavity 50 to increase the light intensity thereof, the signal light having a wavelength in a range of approximately 380 nm-700 nm may be transmitted to a corresponding fingerprint recognition unit 40, and the fingerprint recognition unit 40 may generate corresponding fingerprint information.

In one embodiment, for the light having a wavelength in a range of approximately 380 nm-700 nm, the photoelectric conversion efficiency of the fingerprint recognition unit 40 may be greater than 60%. The cavity length of the first micro-cavity 50 may be adjusted using the light having a wavelength $\lambda$ in a range of approximately 380 nm-700 nm as an example to enhance the intensity of the light having high sensitivity for the fingerprint recognition unit 40. The photoelectric conversion efficiency of the fingerprint recognition unit 40 may be greater than 60% for the light having a wavelength $\lambda$ in a range of approximately 380 nm-700 nm, while which is not limited by the present disclosure. In certain embodiments, the photoelectric conversion efficiency of the fingerprint recognition unit 40 may be greater than 60% for the light having a wavelength λ of other values, which is not repeated herein.

Figure 3:
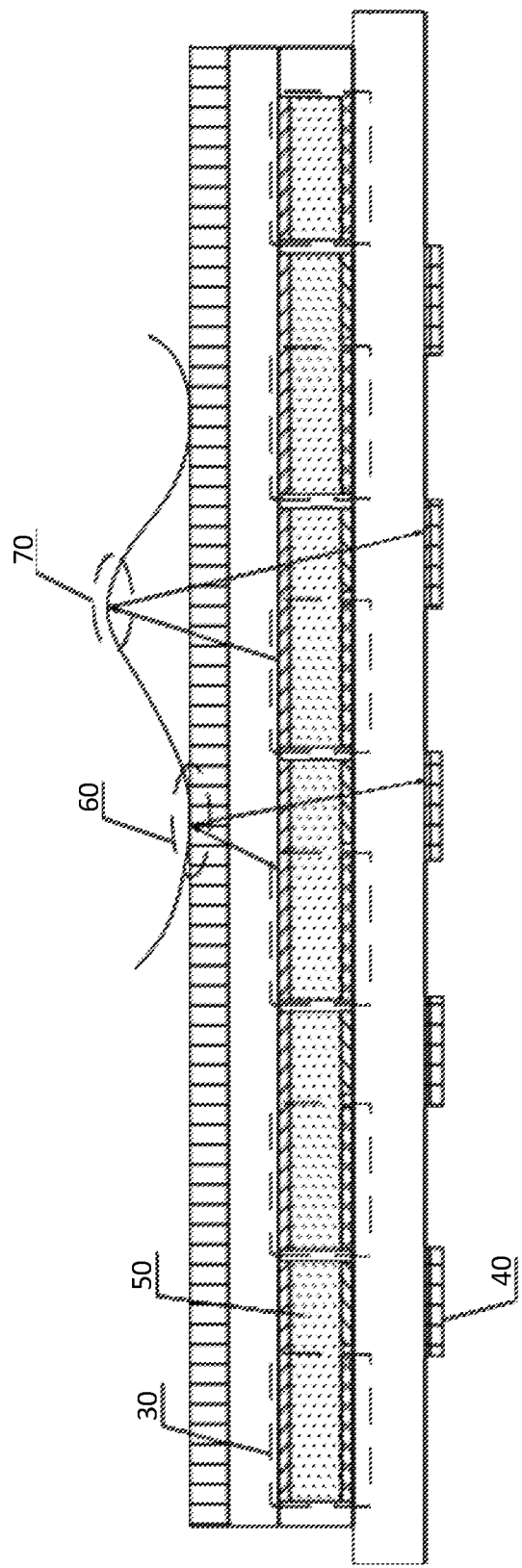
FIG. 3 illustrates a schematic B-B' sectional view of an exemplary display panel in FIG. 1 consistent with disclosed embodiments of the present disclosure.

FIG. 3 illustrates a schematic B-B' sectional view of the display panel in FIG. 1 consistent with disclosed embodiments of the present disclosure. In one embodiment, the organic light-emitting diode 30 may provide a light source for the fingerprint recognition unit 40. The fingerprint recognition unit 40 may be used to recognize fingerprint according to the light emitted from the organic light-emitting diode 30 and reflected by a touch object to the fingerprint recognition unit 40.

In one embodiment, referring to FIG. 3, because a ridge 60 in the fingerprint of a finger pressed on the display panel is in contact with a surface of the display panel, a valley 70 thereof may not be in contact with the surface of the display panel. Thus, the reflectance of the light illuminated onto the valley 70 and the ridge 60 of the fingerprint may be different, which may cause the intensities of the reflected light formed at the position of the ridge 60 and the reflected light formed at the position of the valley 70 that are received by the fingerprint recognition unit 40 to be different. Therefore, the reflected light formed at the position of the ridge 60 and the reflected light formed at the position of the valley 70 may be converted into photocurrents having different magnitudes, and the fingerprint may be recognized according to the magnitudes of the photocurrents.

The organic light-emitting diode 30 may provide the light source for the fingerprint recognition unit 40, and, thus, an extra light source for the fingerprint recognition unit 40 may not be desired, which may reduce a thickness of the display panel and the process steps of the display panel.

In one embodiment, the organic light-emitting diode 30 may provide the light source for the fingerprint recognition unit 40, which is not limited by the present disclosure. In certain embodiments, other light sources may be used to provide the light source for the fingerprint recognition unit, and the intensity of the signal light having a wavelength in a certain range in the light source may be enhanced by the first micro-cavity 50.

In one embodiment, referring to FIG. 2, the organic light-emitting diode 30 may further include a second micro-cavity 34. The second micro-cavity 34 may include at least the organic light-emitting layer 33. A cavity length of the second micro-cavity 34 is L2, where 0.9L1≤L2≤L1.

In one embodiment, the organic light-emitting diode 30 may further include the second micro-cavity 34. The intensity of the light having a wavelength in a certain range may be enhanced by setting a cavity length of the second micro-cavity 34. Therefore, the intensity of the light having a wavelength in a certain range among the light emitted from the organic light-emitting diode 30 may be enhanced by the second micro-cavity 34.

The first micro-cavity 50 may be disposed between adjacent organic light-emitting diodes 30, and the cavity length of the first micro-cavity 50 is L1. After passing through the first micro-cavity 50 to enhance the light intensity thereof, the signal light having a wavelength in a certain range may be transmitted to the corresponding fingerprint identification unit 40, and the fingerprint recognition unit 40 may generate corresponding fingerprint information. The cavity length of the second micro-cavity 34 is L2, where 0.9L1≤L2≤L1. The cavity length of the second micro-cavity 34 may be close or equal to the cavity length of the first micro-cavity 50. The intensity of the light having a wavelength in a certain range among the light emitted from the organic light-emitting diode 30 may be enhanced by the second micro-cavity 34. The light emitted from the organic light-emitting diode 30 may be reflected by the touch object to form the signal light. After passing through the first micro-cavity 50, the signal light may be transmitted to the corresponding fingerprint recognition unit 40. The first micro-cavity 50 may enhance the intensity of the light having a wavelength in a certain range among the signal light. The wavelength range of the light enhanced by the second micro-cavity 34 may be close or equal to the wavelength range of the light enhanced by the first micro-cavity 50. In other words, the fingerprint recognition unit 40 may have a substantially high sensitivity to the light having a wavelength in a certain range. The intensity of the light of the wavelength in the certain range among the light emitted from the organic light-emitting diode 30 may be enhanced by the second micro-cavity 34, and may be enhanced again by the first micro-cavity 50. Therefore, the intensity of the light of the wavelength in the certain range among the light transmitted to the fingerprint recognition unit 40 may further effectively increase, thereby further improving the fingerprint recognition accuracy of the fingerprint recognition unit 40.

Figure 4:
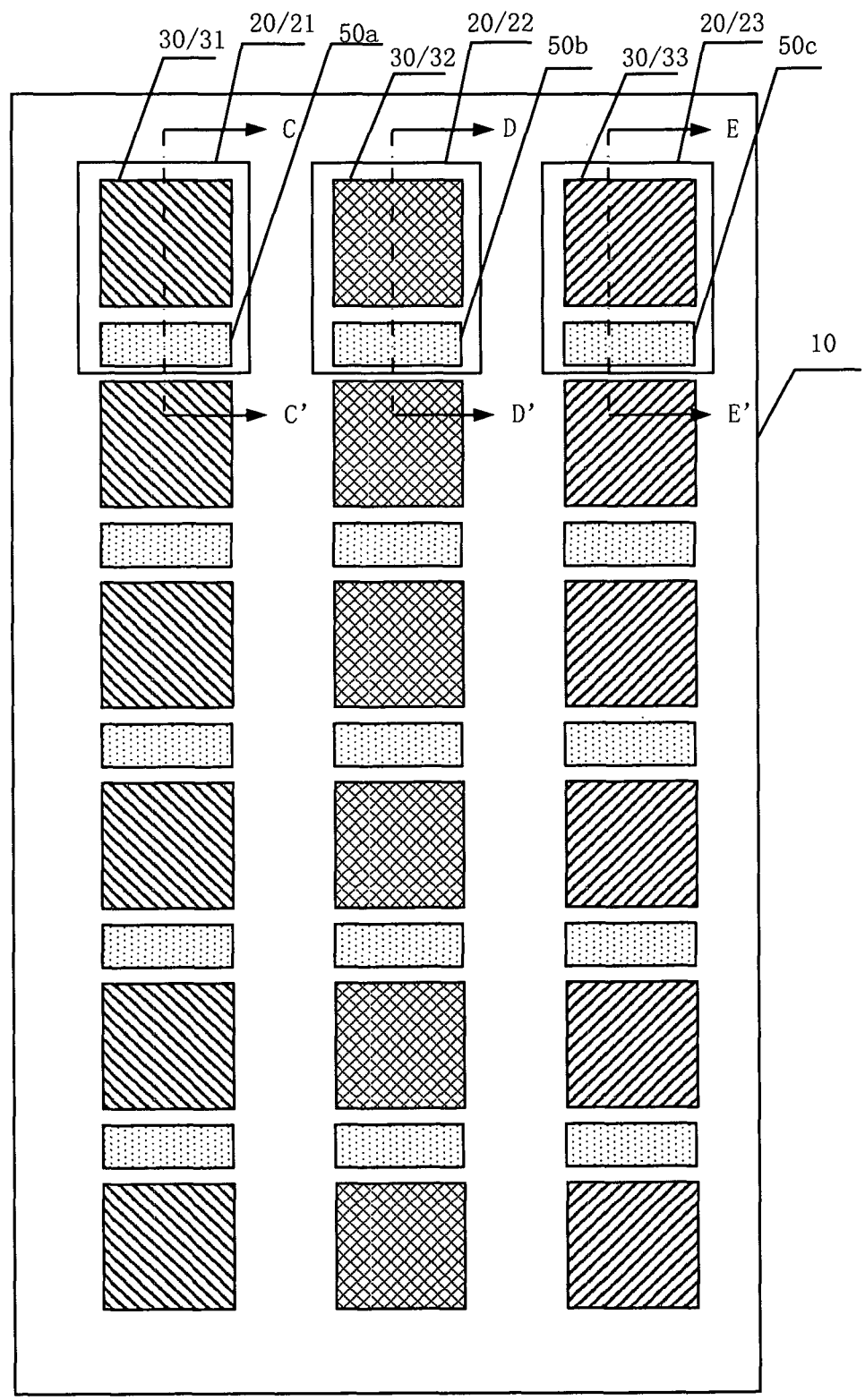
FIG. 4 illustrates a schematic diagram of another exemplary display panel consistent with disclosed embodiments of the present disclosure.
Figure 5:
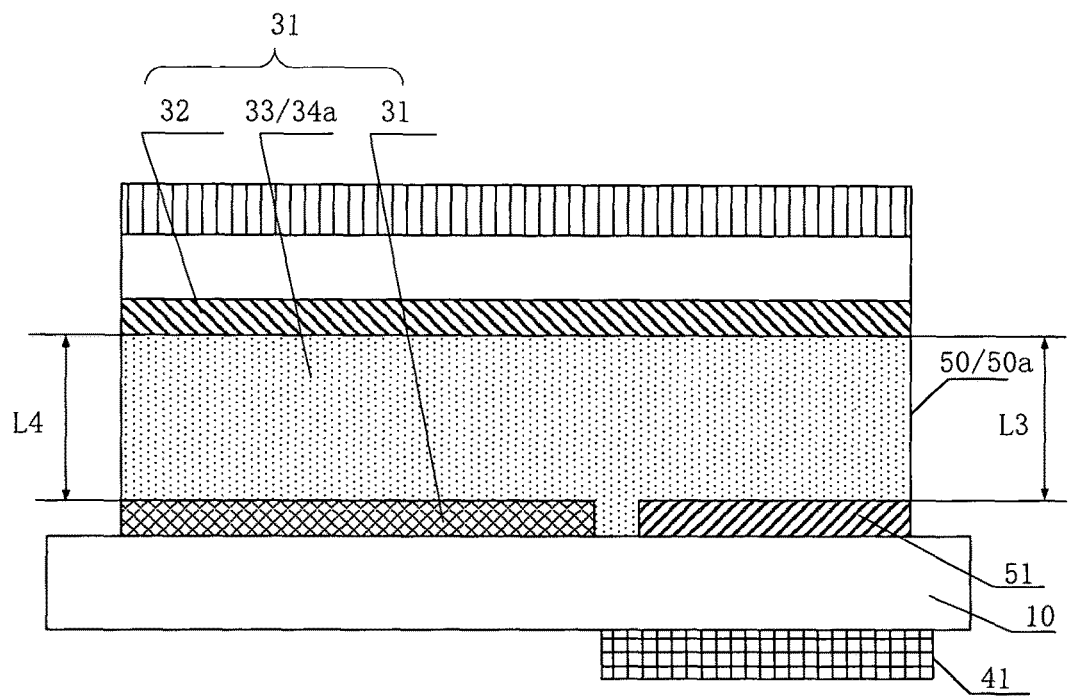
FIG. 5 illustrates a schematic C-C' sectional view of a first unit in an exemplary display panel in FIG. 4 consistent with disclosed embodiments of the present disclosure.

FIG. 4 illustrates a schematic diagram of another display panel consistent with disclosed embodiments of the present disclosure; and FIG. 5 illustrates a schematic C-C' sectional view of a first unit in the display panel in FIG. 4. In one embodiment, referring to FIGS. 4 and 5, the first unit 20 may include at least a first sub-unit 21, a second sub-unit 22, and a third sub-unit 23.

In one embodiment, referring to FIGS. 4 and 5, the first sub-unit 21 may include a red organic light-emitting diode 31 and a first fingerprint recognition unit 41. For the light having a wavelength in a λ range, the photoelectric conversion efficiency of the first fingerprint recognition unit 41 is η, where 60%<η<100%, and 600 nm≤λ≤640 nm.

In one embodiment, referring to FIGS. 4 and 5, the first sub-unit 21 may include the red organic light-emitting diode 31 and the first fingerprint recognition unit 41. The first fingerprint recognition unit 41 may recognize fingerprint according to the light source provided by a corresponding red organic light-emitting diode 31.

The light emitted from the red organic light-emitting diode 31 may have a wavelength in a range of approximately 600 nm-640 nm. For the light having a wavelength λ in a range of approximately 600 nm-640 nm, the photoelectric conversion efficiency of the first fingerprint recognition unit 41 may be greater than 60%. In other words, the first fingerprint recognition unit 41 may be sensitive to the light having a wavelength in a range of approximately 600 nm-640 nm, and, thus, the first fingerprint recognition unit 41 may have a substantially high photoelectric sensitivity for the light having a wavelength in a range of approximately 600 nm-640 nm. A cavity length of a first micro-cavity 50a is L3, where L3=m×λ/2, m is a positive integer, and 600 nm≤λ≤640 nm. In other words, the first micro-cavity 50a may enhance the intensity of the light having a wavelength in a range of approximately 600 nm-640 nm in the light source. A cavity length of a second micro-cavity 34a is L4, where 0.9L3≤L4≤L3. The second micro-cavity 34a and the first micro-cavity 50a each may be used to enhance the intensity of the corresponding light having a wavelength in a range of approximately 600 nm-640 nm emitted from the red organic light-emitting diode 31, which may further improve the fingerprint recognition accuracy of the first fingerprint recognition unit 41.

Figure 6:
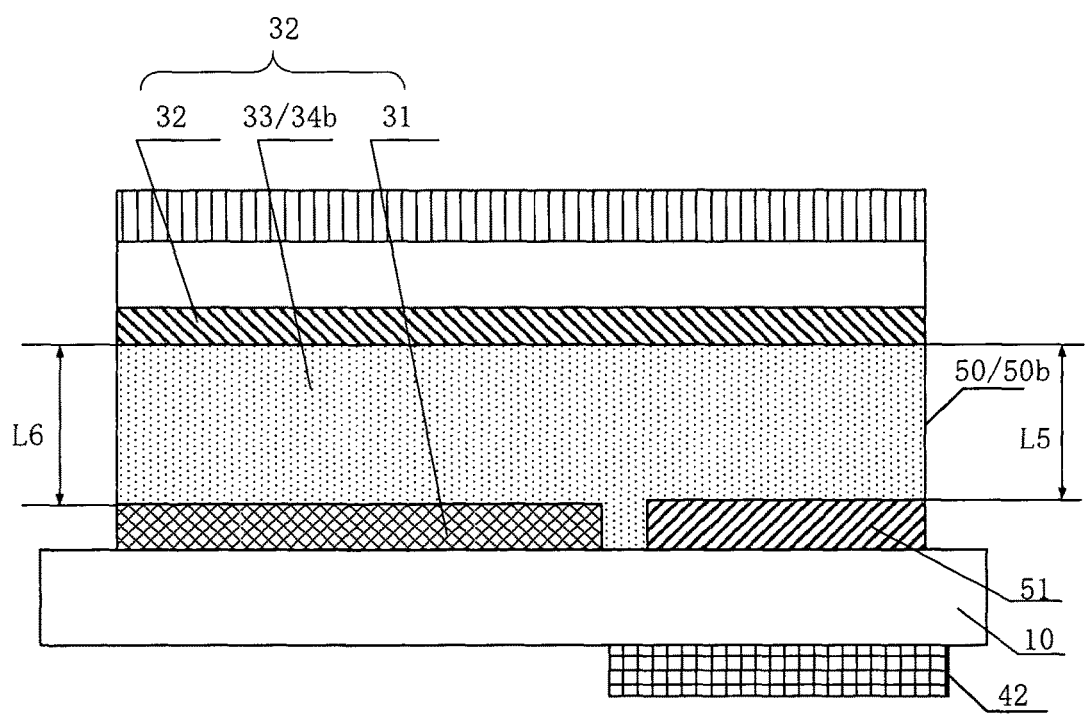
FIG. 6 illustrates a schematic D-D' sectional view of a first unit in an exemplary display panel in FIG. 4 consistent with disclosed embodiments of the present disclosure.

FIG. 6 illustrates a schematic D-D' sectional view of the first unit in the display panel in FIG. 4. In one embodiment, referring to FIGS. 4 and 6, the second sub-unit 22 may include a green organic light-emitting diode 32 and a second fingerprint recognition unit 42. For the light having a wavelength in a λ range, the photoelectric conversion efficiency of the second fingerprint recognition unit 42 is η, where 60%<η<100%, and 500 nm≤λ≤540 nm.

In one embodiment, referring to FIGS. 4 and 6, the second sub-unit 22 may include the green organic light-emitting diode 32 and the second fingerprint recognition unit 42. The second fingerprint recognition unit 42 may recognize fingerprint according to the light source provided by a corresponding green organic light-emitting diode 32.

The light emitted from the green organic light-emitting diode 32 may have a wavelength in a range of approximately 500 nm-540 nm. For the light having a wavelength λ in a range of approximately 500 nm-540 nm, the photoelectric conversion efficiency of the second fingerprint recognition unit 42 may be greater than 60%. In other words, the second fingerprint recognition unit 42 may be sensitive to the light having a wavelength in a range of approximately 500 nm-540 nm, and, thus, the second fingerprint recognition unit 42 may have a substantially high photoelectric sensitivity for the light having a wavelength in a range of approximately 500 nm-540 nm. A cavity length of a first micro-cavity 50b is L5, where L5=m×λ/2, m is a positive integer, and 500 nm≤λ≤540 nm. In other words, the first micro-cavity 50b may enhance the intensity of the light having a wavelength in a range of approximately 500 nm-540 nm in the light source. A cavity length of a second micro-cavity 34b is L6, where 0.9L5≤L6≤L5. The second micro-cavity 34b and the first micro-cavity 50b each may be used to enhance the intensity of the corresponding light having a wavelength in a range of approximately 500 nm-540 nm emitted from the green organic light-emitting diode 32, which may further improve the fingerprint recognition accuracy of the second fingerprint recognition unit 42.

Figure 7:
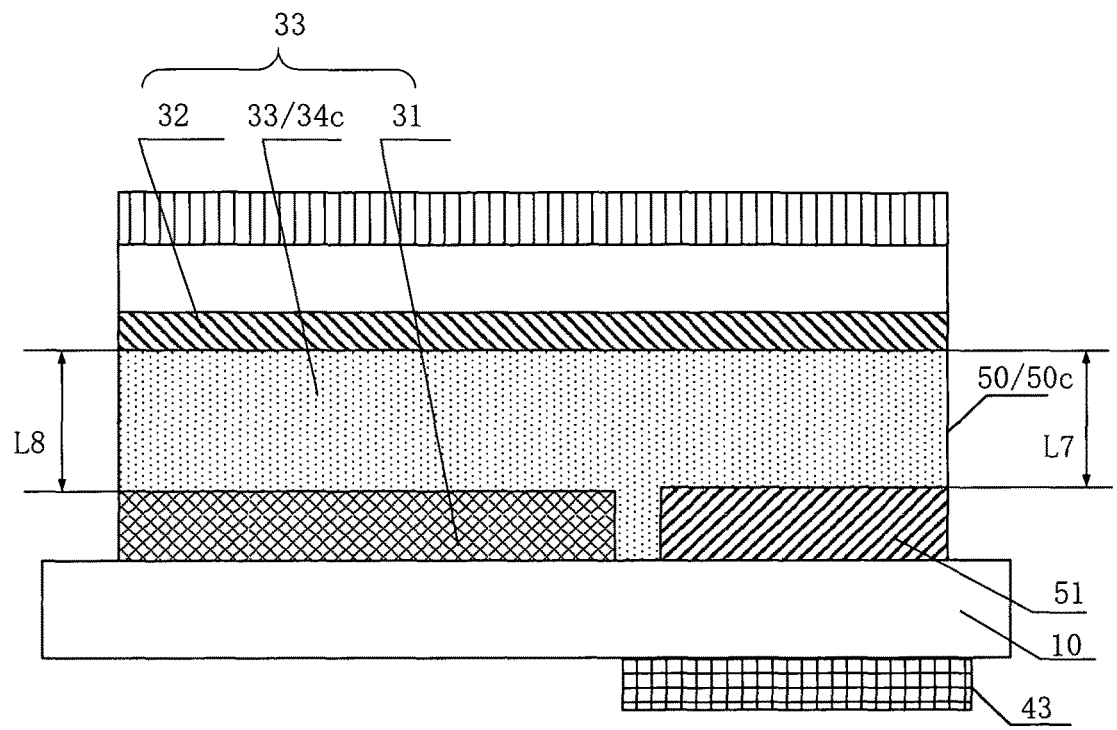
FIG. 7 illustrates a schematic E-E' sectional view of a first unit in an exemplary display panel in FIG. 4 consistent with disclosed embodiments of the present disclosure.

FIG. 7 illustrates a schematic E-E' sectional view of the first unit in the display panel in FIG. 4. In one embodiment, referring to FIGS. 4 and 7, the third sub-unit 23 may include a blue organic light-emitting diode 33 and a third fingerprint recognition unit 43. For the light having a wavelength in a λ range, the photoelectric conversion efficiency of the third fingerprint recognition unit 42 is η, where 60%<η<100%, and 440 nm≤λ≤480 nm.

In one embodiment, referring to FIGS. 4 and 7, the third sub-unit 23 may include the blue organic light-emitting diode 33 and the third fingerprint recognition unit 43. The third fingerprint recognition unit 43 may recognize fingerprint according to the light source provided by a corresponding blue organic light-emitting diode 33.

The light emitted from the blue organic light-emitting diode 33 may have a wavelength in a range of approximately 440 nm-480 nm. For the light having a wavelength λ in a range of approximately 440 nm-480 nm, the photoelectric conversion efficiency of the third fingerprint recognition unit 43 may be greater than 60%. In other words, the third fingerprint recognition unit 43 may be sensitive to the light having a wavelength in a range of approximately 440 nm-480 nm, and, thus, the third fingerprint recognition unit 43 may have a substantially high photoelectric sensitivity for the light having a wavelength in a range of approximately 440 nm-480 nm. A cavity length of a first micro-cavity 50c is L7, where L7=m×λ/2, m is a positive integer, and 440 nm≤λ≤480 nm. In other words, the first micro-cavity 50c may enhance the intensity of the light having a wavelength in a range of approximately 440 nm-480 nm in the light source. A cavity length of a second micro-cavity 34c is L8, where 0.9L7≤L8≤L7. The second micro-cavity 34c and the first micro-cavity 50c each may be used to enhance the intensity of the corresponding light having a wavelength in a range of approximately 440 nm-480 nm emitted from the blue organic light-emitting diode 33, which may further improve the fingerprint recognition accuracy of the third fingerprint recognition unit 43.

The display panel in the disclosed embodiments may include organic light-emitting diodes of different colors, and the organic light-emitting diodes of different colors may emit light of different wavelengths. According to the organic light-emitting diodes of different colors, corresponding cavity lengths of the first micro-cavities may be set to enhance the intensity of light of different wavelengths in a targeted manner, thereby improving the accuracy of the fingerprint recognition units corresponding to the organic light-emitting diodes of different colors.

In one embodiment, the first sub-unit 21 may include the red organic light-emitting diode 31, the second sub-unit 22 may include the green organic light-emitting diode 32, and the third sub-unit 23 may include the blue organic light-emitting diodes 33. In certain embodiments, the organic light-emitting diodes in the first sub-unit 21, the second sub-unit 22, and the third sub-unit 23 may be organic light-emitting diodes of other colors, which is not limited by the present disclosure, and may be determined according to practical applications.

In one embodiment, referring to FIG. 2, the anode 31 may be a total reflection layer, and the first film layer 51 and the cathode 32 may be a semi-reflective layer (i.e., approximately 50% transmitted and 50% reflected).

In one embodiment, the anode 31 may be the total reflection layer, and the cathode 32 may be the semi-reflective layer. When the light propagates in the second micro-cavity 34, the light may be totally reflected to continue to propagate when propagating to the anode 31. When propagating to the cathode 32, because the cathode 32 is the semi-reflective layer, part of the light may continue to be reflected, and part of the light may transmit through the cathode 32 to output. The light transmitted through the cathode 32 may be reflected by the touch object. When the reflected light propagates to the cathode 32 disposed opposite to the first film layer 51, part of the light may continue to be reflected, and part of the light may transmit through the cathode 32 to the first film layer 51. When the light transmitted through the cathode 32 disposed opposite to the first film layer 51 propagates to the first film layer 51, part of the light may continue to be reflected, and part of the light may transmit through the first film layer 51 to output.

The first film layer 51 and the cathode 32 may be the semi-reflective layer. In one embodiment, the first film layer 51 and the cathode 32 may be made of a same material. The first film layer 51 and the cathode 32 may be formed by an evaporation process.

Figure 8:
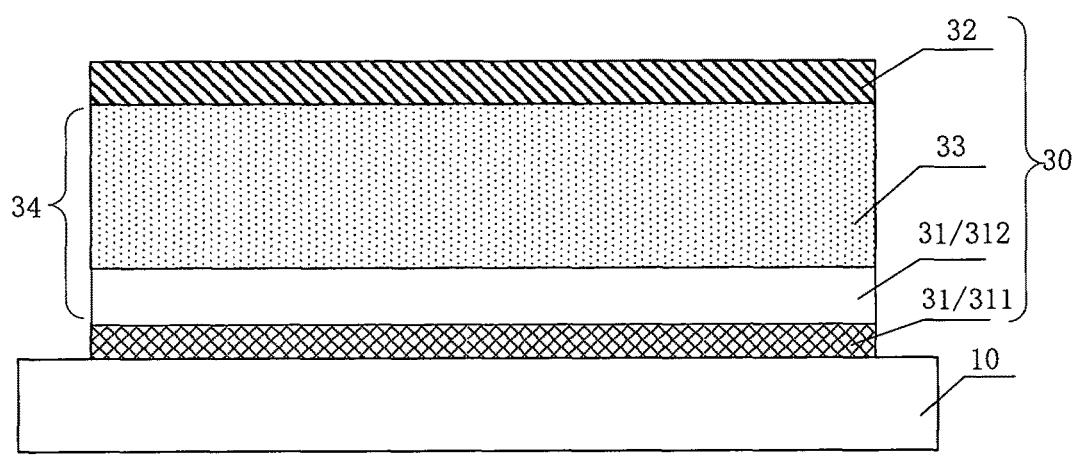
FIG. 8 illustrates a schematic diagram of an exemplary organic light-emitting diode consistent with disclosed embodiments of the present disclosure.

FIG. 8 illustrates a schematic diagram of an organic light-emitting diode consistent with disclosed embodiments of the present disclosure. In one embodiment, referring to FIG. 8, the anode 31 may include a first sub-layer 311 and a second sub-layer 312. The first sub-layer 311 may be disposed between the base substrate 10 and the second sub-layer 312. The first sub-layer 311 may be made of silver, and the second sub-layer 312 may be made of a transparent conductive metal oxide film. The second micro-cavity 34 may include the second sub-layer 312 and the organic light-emitting layer 33.

In one embodiment, referring to FIG. 8, the second micro-cavity 34 may include the second sub-layer 312 and the organic light-emitting layer 33. The cavity length of the second micro-cavity 34 may be a sum of a thickness of the second sub-layer 312 and a thickness of the organic light-emitting layer 33. The cavity length of the second micro-cavity 34 may be changed by changing the thickness of the second sub-layer 312 and/or the thickness of the organic light-emitting layer 33.

Figure 9:
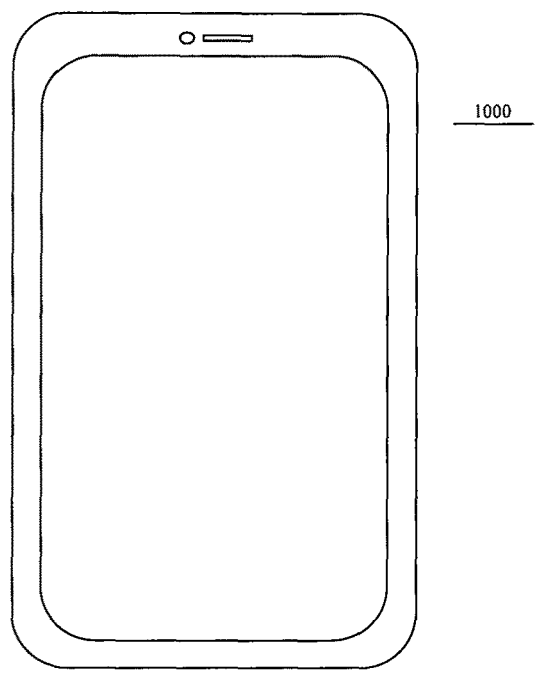
FIG. 9 illustrates a schematic diagram of an exemplary display device consistent with disclosed embodiments of the present disclosure.

FIG. 9 illustrates a schematic diagram of a display device consistent with disclosed embodiments of the present disclosure. A display device 1000 in the disclosed embodiments may include any one of the display panels in the disclosed embodiments.

In one embodiment, referring to FIG. 9, the display device 1000 in the disclosed embodiments may be a mobile phone. The display device 1000 may include any one of the display panels in the disclosed embodiments. Further, those skilled in the art can understand that in addition to the display panel, the display device 1000 in the disclosed embodiments may include other well-known structures. The well-known structures will not be further described to avoid obscuring the scope of the present disclosure. The display device in the disclosed embodiments may be a computer, a television, or an electronic book, etc., which is not limited by the present disclosure.

Figure 10:
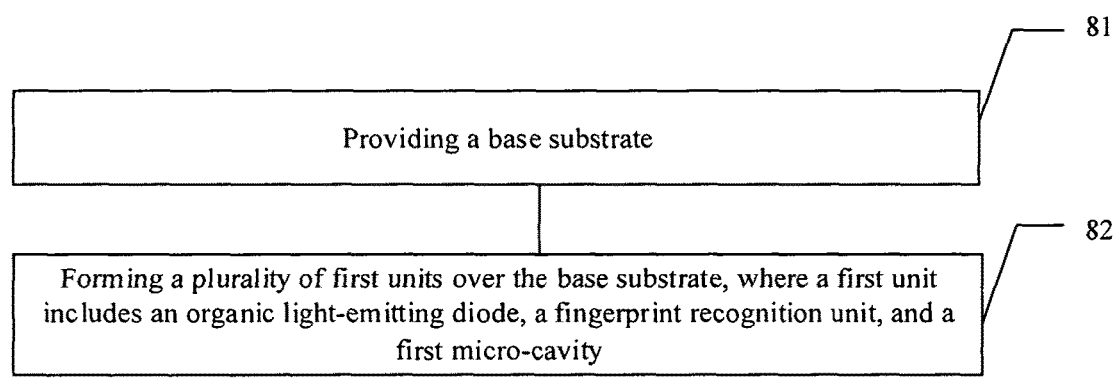
FIG. 10 illustrates a flow chart of an exemplary fabrication method for forming a display panel consistent with disclosed embodiments of the present disclosure.

FIG. 10 illustrates a flow chart of a fabrication method for forming a display panel consistent with disclosed embodiments of the present disclosure. Referring to FIGS. 1, 2 and 10, the fabrication method for forming the display panel in the disclosed embodiments may include the following:

S81: Providing a base substrate 10; and

S82: Forming a plurality of first units 20 over the base substrate 10, where a first unit 20 may include an organic light-emitting diode 30, a fingerprint recognition unit 40, and a first micro-cavity 50.

The organic light-emitting diode 30 may include an anode 31, a cathode 32 disposed opposite to the anode 31, and an organic light-emitting layer 33 disposed between the anode 31 and the cathode 32. A plurality of first film layers 51 may be formed over the base substrate 10, and a first film layer 51 may be disposed between two adjacent mutually insulated anodes 31. The cathode 32 may cover the anode 31 and the first film layer 51. The first micro-cavity 50 may be formed between the first film layer 51 and the cathode 32. The fingerprint recognition unit 40 may be disposed over a side of the first film layer 51 away from the cathode 32.

In the display panel fabricated by the fabrication method in the disclosed embodiments, when recognizing the fingerprint, after passing through the first micro-cavity 50, the signal light may be transmitted to a corresponding fingerprint recognition unit 40. Thus, the intensity of the light transmitted to the fingerprint recognition unit 40 may effectively increase, thereby effectively improving the fingerprint recognition accuracy of the fingerprint recognition unit 40.

In the display panel and fabrication method, and the display device in the disclosed embodiments, the first micro-cavity may be formed between the first film layer and the cathode. The intensity of the light having a wavelength in a certain range may be enhanced by setting the cavity length of the first micro-cavity. The fingerprint recognition unit may be disposed over the side of the first film layer away from the cathode. In other words, after passing through the first micro-cavity, the signal light may be transmitted to a corresponding fingerprint recognition unit. Therefore, the intensity of the light transmitted to the fingerprint recognition unit may effectively increase, thereby effectively improving the fingerprint recognition accuracy of the fingerprint recognition unit.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A display panel, comprising:
a base substrate;
a plurality of first units formed over the base substrate, wherein:
 a first unit of the plurality of first units includes an organic light-emitting diode, a fingerprint recognition unit, and a first micro-cavity, and
 the organic light-emitting diode includes an anode, a cathode disposed opposite to the anode, and an organic light-emitting layer disposed between the anode and the cathode; and
a plurality of first film layers formed over the base substrate, wherein a first film layer of the plurality of first film layers is disposed between two adjacent mutually insulated anodes and wherein:
 the cathode covers the anode and the first film layer,
 the first micro-cavity is formed between the first film layer and the cathode, and
 the fingerprint recognition unit is disposed over a side of the first film layer away from the cathode.

2. The display panel according to claim 1, wherein:
for light having a wavelength in a λ range, a photoelectric conversion efficiency of the fingerprint recognition unit is η, wherein 60%<η<100%, and 380 nm≤λ≤700 nm.

3. The display panel according to claim 2, wherein:
a cavity length of the first micro-cavity is L1, wherein L1=m×λ/2, and m is a positive integer.

4. The display panel according to claim 3, wherein:
the organic light-emitting diode further includes a second micro-cavity, wherein:
 the second micro-cavity at least includes the organic light-emitting layer, and
 a cavity length of the second micro-cavity is L2, wherein 0.9L1≤L2≤L1.

5. The display panel according to claim 4, wherein:
the first unit at least includes a first sub-unit, a second sub-unit, and a third sub-unit.

6. The display panel according to claim 5, wherein:
the first sub-unit includes a red organic light-emitting diode and a first fingerprint recognition unit, and
for light having a wavelength in a λ range, a photoelectric conversion efficiency of the first fingerprint recognition unit is η, wherein 60%<η<100%, and 600 nm≤λ≤640 nm.

7. The display panel according to claim 5, wherein:
the second sub-unit includes a green organic light-emitting diode and a second fingerprint recognition unit, and
for light having a wavelength in a λ range, a photoelectric conversion efficiency of the second fingerprint recognition unit is η, wherein 60%<η<100%, and 500 nm≤λ≤540 nm.

8. The display panel according to claim 5, wherein:
the third sub-unit includes a blue organic light-emitting diode and a third fingerprint recognition unit, and
for light having a wavelength in a λ range, a photoelectric conversion efficiency of the third fingerprint recognition unit is η, wherein 60%<η<100%, and 440 nm≤λ≤480 nm.

9. The display panel according to claim 1, wherein:
the anode is a total reflection layer, and
each of the first film layer and the cathode is a semi-reflective layer.

10. The display panel according to claim 9, wherein:
the first film layer is made of a same material as the cathode.

11. The display panel according to claim 4, wherein:
the anode includes a first sub-layer and a second sub-layer,
the first sub-layer is disposed between the base substrate and the second sub-layer,
the first sub-layer is made of silver, and
the second sub-layer is made of a transparent conductive metal oxide film.

12. The display panel according to claim 11, wherein:
the second micro-cavity includes the second sub-layer and the organic light-emitting layer.

13. The display panel according to claim 12, wherein:
the cavity length of the second micro-cavity is a sum of a thickness of the second sub-layer and a thickness of the organic light-emitting layer.

14. The display panel according to claim 1, wherein:
the organic light-emitting diode provides a light source for the fingerprint recognition unit, and
the fingerprint recognition unit is used to recognize a fingerprint according to light emitted from the organic light-emitting diode and reflected by a touch object to the fingerprint recognition unit.

15. A display device, comprising:
a display panel including:
a base substrate;
a plurality of first units formed over the base substrate, wherein:
 a first unit of the plurality of first units includes an organic light-emitting diode, a fingerprint recognition unit, and a first micro-cavity, and
 the organic light-emitting diode includes an anode, a cathode disposed opposite to the anode, and an organic light-emitting layer disposed between the anode and the cathode; and
a plurality of first film layers formed over the base substrate, wherein a first film layer of the plurality of first film layers is disposed between two adjacent mutually insulated anodes and wherein:
 the cathode covers the anode and the first film layer,
 the first micro-cavity is formed between the first film layer and the cathode, and
 the fingerprint recognition unit is disposed over a side of the first film layer away from the cathode.

16. A method for forming a display panel, comprising:
providing a base substrate; and
forming a plurality of first units over the base substrate, wherein:
 a first unit of the plurality of first units includes an organic light-emitting diode, a fingerprint recognition unit, and a first micro-cavity, and
 the organic light-emitting diode includes an anode, a cathode disposed opposite to the anode, and an organic light-emitting layer disposed between the anode and the cathode; and
forming a plurality of first film layers over the base substrate, wherein a first film layer of the plurality of first film layers is disposed between two adjacent mutually insulated anodes and wherein:
 the cathode covers the anode and the first film layer,
 the first micro-cavity is formed between the first film layer and the cathode, and
 the fingerprint recognition unit is disposed over a side of the first film layer away from the cathode.

17. The method according to claim 16, wherein:
for light having a wavelength in a λ range, a photoelectric conversion efficiency of the fingerprint recognition unit is η, wherein 60%<η<100%, and 380 nm≤λ≤700 nm; and
a cavity length of the first micro-cavity is L1, wherein $L1 = m \times \lambda/2$, and m is a positive integer.

18. The method according to claim 17, wherein:
the organic light-emitting diode further includes a second micro-cavity, wherein:
 the second micro-cavity at least includes the organic light-emitting layer, and
 a cavity length of the second micro-cavity is L2, wherein $0.9L1 \leq L2 \leq L1$.

19. The method according to claim 16, wherein:
the anode is a total reflection layer, and
each of the first film layer and the cathode is a semi-reflective layer.

20. The method according to claim 17, wherein:
the first film layer is made of a same material as the cathode.

* * * * *